(12) United States Patent
Kojima et al.

(10) Patent No.: US 9,761,454 B2
(45) Date of Patent: Sep. 12, 2017

(54) METHOD OF POLISHING SIC SUBSTRATE

(71) Applicant: DISCO CORPORATION, Tokyo (JP)

(72) Inventors: Katsuyoshi Kojima, Tokyo (JP); Takeshi Sato, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/924,938

(22) Filed: Oct. 28, 2015

(65) Prior Publication Data

US 2016/0133466 A1 May 12, 2016

(30) Foreign Application Priority Data

Nov. 6, 2014 (JP) ................................ 2014-225757

(51) Int. Cl.
| | |
|---|---|
| H01L 21/04 | (2006.01) |
| H01L 21/02 | (2006.01) |
| B24B 37/04 | (2012.01) |
| B24B 37/10 | (2012.01) |
| H01L 29/16 | (2006.01) |

(52) U.S. Cl.
CPC ........ H01L 21/0475 (2013.01); B24B 37/042 (2013.01); B24B 37/107 (2013.01); H01L 21/02024 (2013.01); H01L 29/1608 (2013.01)

(58) Field of Classification Search
CPC .......... H01L 21/0475; H01L 21/02024; H01L 29/1608; B24B 37/042; B24B 37/107
See application file for complete search history.

(56) References Cited

U.S. PATENT DOCUMENTS

| | | | | |
|---|---|---|---|---|
| 2010/0279506 | A1* | 11/2010 | White ...................... | C09G 1/02 438/693 |
| 2012/0247155 | A1* | 10/2012 | Murakami ................ | C03B 7/11 65/60.1 |
| 2016/0060488 | A1* | 3/2016 | Singh ................... | C09K 3/1436 216/53 |

FOREIGN PATENT DOCUMENTS

| | | | |
|---|---|---|---|
| CN | 101602185 | * 12/2009 | ............. B24B 29/02 |
| JP | 2008-068390 | 3/2008 | |

OTHER PUBLICATIONS

Resource Center found in web site www.nde-ed.org/GeneralResources/HardnessConv/HardnessConvPrint.pdf (1987) 3 pages.*
Shore (Durometer) Hardness Testing of Plastics. Found in internet page"http://www.matweb.com/reference/shore-hardness.aspx" (first published 2007) (3 pages). Used Only as Evidence.*

* cited by examiner

*Primary Examiner* — Duy Deo
*Assistant Examiner* — Mahmoud Dahimene
(74) *Attorney, Agent, or Firm* — Greer Burns & Crain, Ltd.

(57) ABSTRACT

A method of polishing a SiC substrate by supplying a polishing liquid and bringing a polishing pad into contact with the SiC substrate is provided. The polishing liquid contains a permanganate, inorganic salts having an oxidizing ability, and water. The method includes: a first polishing step of polishing the SiC substrate by use of a first polishing pad; and a second polishing step of polishing the SiC substrate by use of a second polishing pad softer than the first polishing pad after the first polishing step.

2 Claims, 2 Drawing Sheets

METHOD OF POLISHING SIC SUBSTRATE

BACKGROUND OF THE INVENTION

Field of the Invention

The present invention relates to a method of polishing a SiC substrate.

Description of the Related Art

In power electronics apparatuses such as inverters, there are incorporated semiconductor devices called power devices which are suitable for control of electric power. Conventional power devices have been produced mainly by using single crystal Si (silicon), and enhancement of their performance has been realized by improvements in device structure.

In recent years, however, the enhancement of device performance through improvements in device structure has been hitting a ceiling. For this reason, an attention has come to be paid to single crystal SiC (silicon carbide) which is advantageous over single crystal Si for realization of power devices with higher withstand voltage and lower loss.

Prior to fabrication of power devices into a substrate composed of single crystal SiC, a surface of the substrate is planarized by chemical mechanical polishing (CMP). In order to enhance polishing efficiency in CMP, there has been developed a polishing technique based on the use of a polishing pad containing abrasive grains and a polishing liquid having an oxidizing ability (see, for example, Japanese Patent Laid-open No. 2008-68390).

SUMMARY OF THE INVENTION

However, when a single crystal SiC substrate is polished using a polishing liquid having an oxidizing ability as aforementioned, disorder would occur in the crystal lattice of the single crystal SiC, resulting in a large lowering in the power device performance.

Accordingly, it is an object of the present invention to provide a method of polishing a SiC substrate by which disorder in crystal lattice can be restrained while maintaining a high polishing efficiency.

In accordance with an aspect of the present invention, there is provided a method of polishing a SiC substrate by supplying a polishing liquid to a polishing pad containing abrasive grains or a polishing pad not containing abrasive grains and bringing the polishing pad into contact with the SiC substrate, wherein the polishing liquid contains a permanganate, inorganic salts having an oxidizing ability, and water, and the method includes: a first polishing step of polishing the SiC substrate by use of a first polishing pad; and a second polishing step of polishing the SiC substrate by use of a second polishing pad softer than the first polishing pad after the first polishing step.

In the method of polishing a SiC substrate according to the present invention, the polishing liquid containing a permanganate, inorganic salts having an oxidizing ability and water is used, the SiC substrate is polished using the first polishing pad and thereafter the SiC substrate is polished using the second polishing pad softer than the first polishing pad. Therefore, disorder in crystal lattice can be restrained while maintaining a high polishing efficiency.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described below, referring to the attached drawings. A method of polishing a SiC substrate according to the present embodiment includes at least a first polishing step and a second polishing step. In the first polishing step, a SiC substrate is polished using a first polishing pad. In the second polishing step, the SiC substrate is polished using a second polishing pad softer than the first polishing pad. The method of polishing a SiC substrate according to the present embodiment will be described in detail below.

Figure 1:
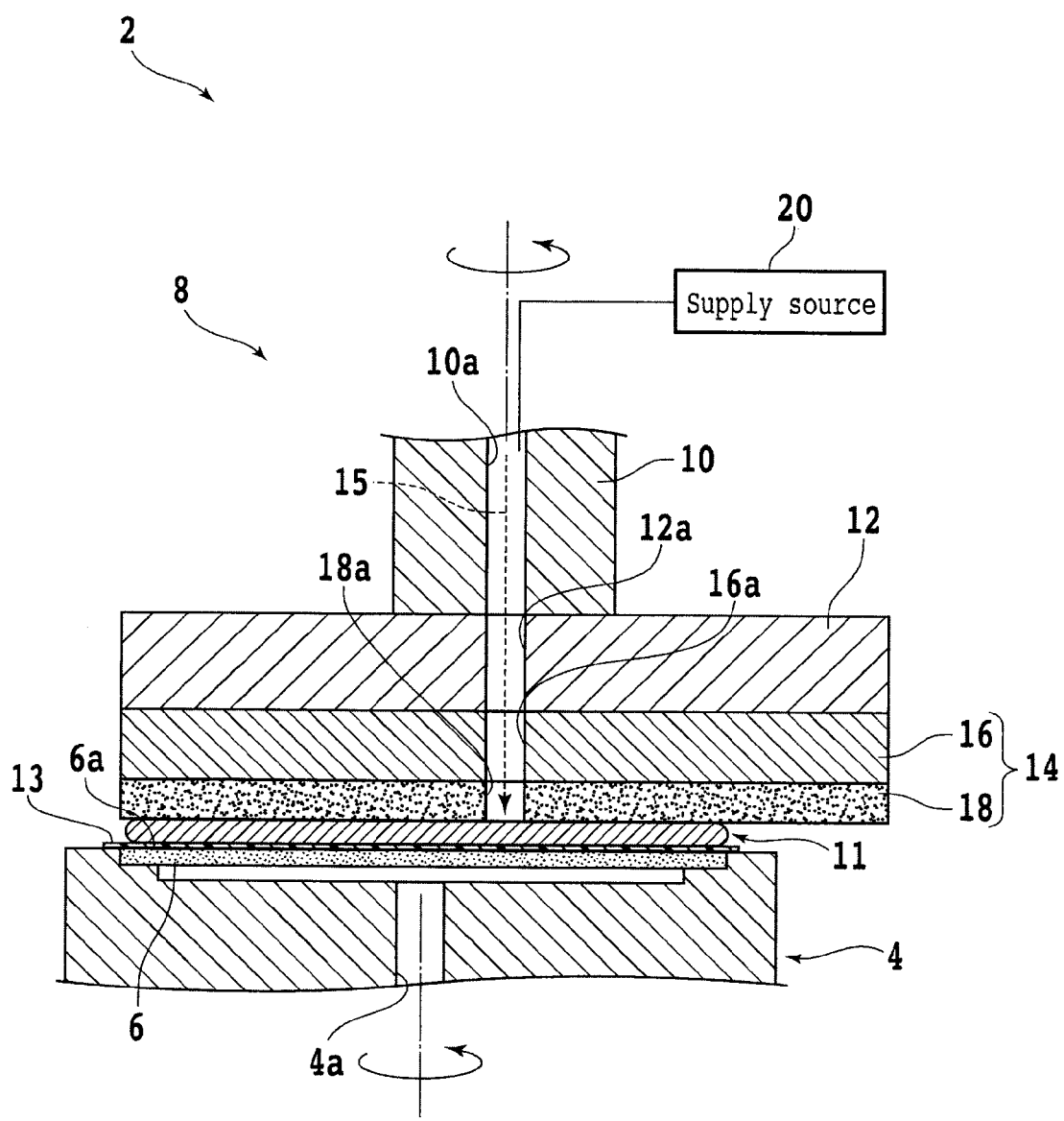
FIG. 1 illustrates schematically a first polishing step.

First, the first polishing step is conducted in which the SiC substrate is polished by using the first polishing pad. FIG. 1 illustrates schematically the first polishing step. As shown in FIG. 1, a polishing apparatus 2 used in the present embodiment includes a chuck table 4 for holding a SiC substrate 11 by suction. The chuck table 4 is connected with a rotational drive source (not shown) such as a motor, and is rotated about a rotational axis parallel to the vertical direction. Under the chuck table 4 is provided a moving unit (not shown), by which the chuck table 4 is moved horizontally. A top surface of the chuck table 4 is formed with a recess, in which is fitted a holding plate 6 formed from a porous material. A top surface of the holding plate 6 constitutes a holding surface 6a on which to hold by suction the disk-shaped SiC substrate 11 composed of single crystal SiC. On the holding surface 6a, a negative pressure of a suction source (not shown) is permitted to act through a passage 4a formed in the inside of the chuck table 4. As depicted in FIG. 1, a film 13 greater in diameter than the holding surface 6a is attached to the lower side of the SiC substrate 11. When the negative pressure of the suction source is permitted to act on the holding surface 6a, with the film 13 in contact with the holding surface 6a, the SiC substrate 11 is suction held onto the chuck table 4 through the film 13 therebetween.

Above the chuck table 4 is disposed a first polishing unit 8 for polishing the SiC substrate 11. The first polishing unit 8 includes a first spindle 10 constituting a rotary shaft. At a lower end portion (tip portion) of the first spindle 10 is provided a first wheel mount 12. Onto a lower surface of the first wheel mount 12 is mounted a first polishing wheel 14 which is substantially equal in diameter to the first wheel mount 12. The first polishing wheel 14 includes a first wheel base 16 formed from a metallic material such as stainless steel or aluminum. To a lower surface of the first wheel base 16 is fixed a disk-shaped first polishing pad 18. The first polishing pad 18 is formed from a material obtained by mixing abrasive grains with a rigid polyurethane having a hardness of 40 to 80 as measured by a durometer type D (Shore D) as specified in ISO 7619. It is to be noted, however, that the first polishing pad 18 is not limited to this. The first polishing pad 18 may not necessarily contain abrasive grains. An upper end (base end) of the first spindle 10 is connected with a rotational drive source (not shown) such as a motor. The first polishing wheel 14 is rotated about a rotational axis parallel to the vertical direction, by a rotational force transmitted from the rotational drive source.

The first spindle 10, the first wheel mount 12, the first wheel base 16, and the first polishing pad 18 are formed therein with longitudinal holes 10a, 12a, 16a, and 18a piercing them in the vertical direction, respectively. A lower end of the longitudinal hole 10a and an upper end of the longitudinal hole 12a are connected to each other, a lower end of the longitudinal hole 12a and an upper end of the longitudinal hole 16a are connected to each other, and a lower end of the longitudinal hole 16a and an upper end of the longitudinal hole 18a are connected to each other. An upper end of the longitudinal hole 10a is connected with a supply source 20 for supplying a polishing liquid 15 through a piping or the like. In the supply source 20 is stored the polishing liquid 15 which contains a permanganate, inorganic salts having an oxidizing ability, and water. Here, the permanganate is an oxoacid salt of manganese, represented by potassium permanganate and sodium permanganate. The inorganic salts having an oxidizing ability are oxidizing solids (corresponding to category I of hazardous materials under Japanese Fire Service Law), such as chlorinates, sulfates, nitrates, and chromates. The polishing liquid 15 fed from the supply source 20 into the longitudinal hole 10a is supplied via an opening of the longitudinal hole 18a formed in the center of the lower surface of the first polishing pad 18 to an area of contact between the SiC substrate 11 and the first polishing pad 18. It is to be noted that the polishing liquid 15 may contain abrasive grains mixed therein.

While the chuck table 4 and the first spindle 10 kept rotated, the first polishing wheel 14 is lowered to bring the lower surface of the first polishing pad 18 into contact with the upper side of the SiC substrate 11 while supplying the polishing liquid 15, whereby the upper side of the SiC substrate 11 can be polished. The first polishing step is finished when the SiC substrate 11 has been polished to reach a preset arbitrary polishing amount.

Figure 2:
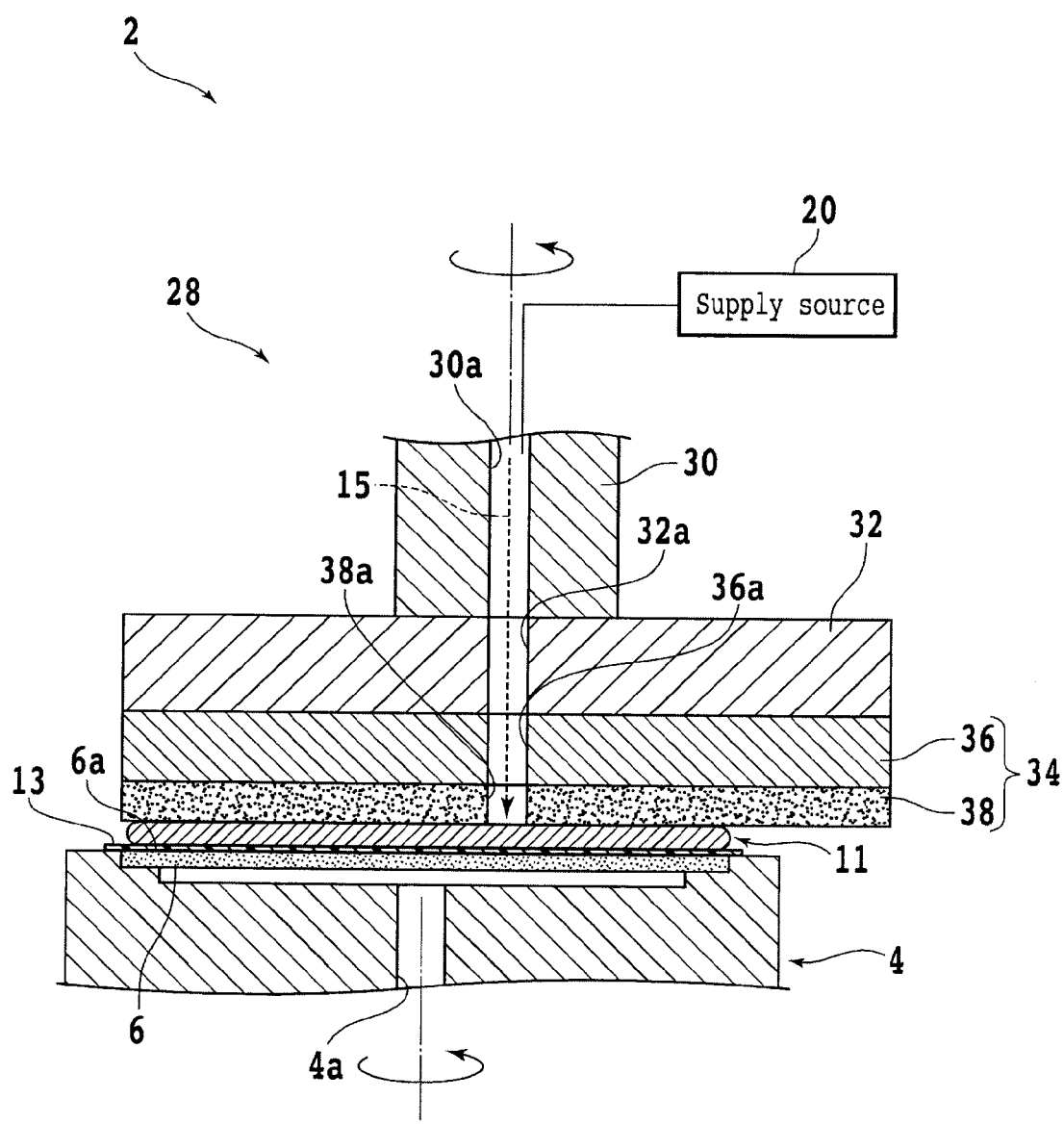
FIG. 2 illustrates schematically a second polishing step.

After the first polishing step, the second polishing step is carried out in which the SiC substrate is polished using the second polishing pad softer than the first polishing pad 18. FIG. 2 illustrates schematically the second polishing step. As shown in FIG. 2, a polishing apparatus 2 includes a second polishing unit 28 different from the first polishing unit 8. The second polishing unit 28 includes a second spindle 30 constituting a rotary shaft. At a lower end portion (tip portion) of the second spindle 30 is provided a disk-shaped second wheel mount 32. Onto a lower surface of the second wheel mount 32 is mounted a second polishing wheel 34 which is substantially equal in diameter to the second wheel mount 32. The second polishing wheel 34 includes a second wheel base 36 formed from a metallic material such as stainless steel or aluminum. To a lower surface of the second wheel base 36 is fixed a disk-shaped second polishing pad 38. The second polishing pad 38 is formed, for example, from a material obtained by mixing abrasive grains with a flexible polyurethane having a hardness of 50 to 90 as measured by a durometer type A (Shore A) as specified in ISO 7619. It is to be noted, however, that the second polishing pad 38 is not limited to this. The second polishing pad 38 may not necessarily contain abrasive grains. An upper end (base end) of the second spindle 30 is connected with a rotational drive source (not shown) such as a motor. The second polishing wheel 34 is rotated about a rotational axis parallel to the vertical direction, by a rotational force transmitted from the rotational drive source.

The second spindle 30, the second wheel mount 32, second wheel base 36, and the second polishing pad 38 are formed therein with longitudinal holes 30a, 32a, 36a, and 38a piercing them in the vertical direction, respectively. A lower end of the longitudinal hole 30a and an upper end of the longitudinal hole 32a are connected to each other, a lower end of the longitudinal hole 32a and an upper end of the longitudinal hole 36a are connected to each other, and a lower end of the longitudinal hole 36a and an upper end of the longitudinal hole 38a are connected to each other. An upper end of the longitudinal hole 30a is connected with a supply source 20 for supplying a polishing liquid 15, through a piping or the like. The polishing liquid 15 fed from the supply source 20 into the longitudinal hole 10a is supplied through an opening of the longitudinal hole 38a formed in the center of the lower surface of the second polishing pad 38 to an area of contact between the SiC substrate 11 and the second polishing pad 38.

While the chuck table 4 and the second spindle 30 are kept rotating, the second polishing wheel 34 is lowered to bring the lower surface of the second polishing pad 38 into contact with the upper side of the SiC substrate 11 while supplying the polishing liquid 15, whereby the upper surface of the SiC substrate 11 can be polished. The second polishing step is finished when the SiC substrate 11 has been polished to reach a preset arbitrary polishing amount. In the second polishing step, the second polishing pad 38 softer than the first polishing pad 18 used in the first polishing step is used, so that disorder which might occur in crystal lattice can be restrained. It is to be noted that the polishing amount in the first polishing step and the polishing amount in the second polishing step are preferably regulated so that the efficiency and quality of polishing can be maintained at high levels.

As has been described above, in the method of polishing a SiC substrate according to the present embodiment, the SiC substrate 11 is polished by using the polishing liquid containing the permanganate, the inorganic salts having an oxidizing ability and water and using the first polishing pad 18, and thereafter the SiC substrate 11 is polished by using the second polishing pad 38 softer than the first polishing pad 18, so that disorder in crystal lattice can be restrained while maintaining a high polishing efficiency.

It is to be noted that the present invention is not limited to the description of the embodiment above, and the invention can be carried out with various modifications. For instance, while the polishing apparatus 2 including the first polishing unit 8 and the second polishing unit 28 is used in the above embodiment, two polishing apparatuses having their polishing units may be used. Besides, the SiC substrate can be polished by a single polishing apparatus having a set of polishing unit. In this case, for example, it is sufficient that the polishing wheel (polishing pad) is replaced prior to starting the second polishing step.

The present invention is not limited to the details of the above described preferred embodiment. The scope of the invention is defined by the appended claims and all changes and modifications as fall within the equivalence of the scope of the claims are therefore embraced by the invention.

What is claimed is:

1. A method of polishing a single crystal SiC substrate by supplying a polishing liquid to a polishing pad containing abrasive grains or a polishing pad not containing abrasive grains and bringing the polishing pad into contact with the SiC substrate,
   wherein the polishing liquid contains a permanganate, inorganic salts having an oxidizing ability, and water, and
   the method comprises:
   a first polishing step of polishing the SiC substrate by use of a first polishing pad; and a second polishing step of polishing the SiC substrate by use of a second polishing pad softer than the first polishing pad after the first polishing step, wherein the first polishing pad includes flexible polyurethane having a Shore D hardness in the range of 40-80, wherein the second polishing pad includes flexible polyurethane having a Shore A hardness in the range of 50-90, further wherein the polishing pad of the second polishing step is configured and arranged to restrain disorder in the crystal lattice of the single crystal SiC substrate, and still further wherein the polishing liquid used during said first polishing step has the same composition as the polishing liquid used during said second polishing step.

2. The method of polishing according to claim 1, wherein:

said permanganate of said polishing liquid comprises sodium permanganate; and said inorganic salt of said polishing liquid comprises a chlorinate.

* * * * *